United States Patent
van Schravendijk et al.

(10) Patent No.: US 7,981,763 B1
(45) Date of Patent: Jul. 19, 2011

(54) ATOMIC LAYER REMOVAL FOR HIGH ASPECT RATIO GAPFILL

(75) Inventors: Bart van Schravendijk, Sunnyvale, CA (US); Harald te Nijenhuis, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 79 days.

(21) Appl. No.: 12/341,943

(22) Filed: Dec. 22, 2008

Related U.S. Application Data (60) Provisional application No. 61/089,453, filed on Aug. 15, 2008.

(51) Int. Cl.
  *H01L 21/76* (2006.01)
(52) U.S. Cl. .................. 438/424; 257/E21.546
(58) Field of Classification Search .......... 438/424; 257/E21.546
  See application file for complete search history.

(56) References Cited

U.S. PATENT DOCUMENTS

| | | | |
|---|---|---|---|
| 4,414,069 A * | 11/1983 | Cuomo | |
| 4,695,327 A | 9/1987 | Grebinski | |
| 4,756,794 A | 7/1988 | Yoder | |
| 5,030,319 A | 7/1991 | Nishino et al. | |
| 5,268,069 A | 12/1993 | Chapple-Sokol et al. | |
| 5,282,925 A | 2/1994 | Jeng et al. | |
| 5,474,641 A | 12/1995 | Otsuki et al. | |
| 5,505,816 A | 4/1996 | Barnes et al. | |
| 5,636,320 A | 6/1997 | Yu et al. | |
| 5,766,971 A | 6/1998 | Ahlgren et al. | |
| 5,792,275 A * | 8/1998 | Natzle et al. | |
| 5,838,055 A * | 11/1998 | Kleinhenz et al. | |
| 5,876,879 A * | 3/1999 | Kleinhenz et al. | |
| 5,968,279 A | 10/1999 | Macleish et al. | |
| 5,976,973 A | 11/1999 | Ohira et al. | |
| 5,994,240 A | 11/1999 | Thakur | |

(Continued)

FOREIGN PATENT DOCUMENTS

WO 2004/001809 * 12/2003

OTHER PUBLICATIONS

Liu et al., "Adsorption Based Material Removal Process," Novellus Systems, Inc., U.S. Appl. No. 11/479,812, filed Jun. 30, 2006.*

(Continued)

*Primary Examiner* — Matthew C Landau
*Assistant Examiner* — Sonya D McCall Shepard
(74) *Attorney, Agent, or Firm* — Weaver Austin Villeneuve & Sampson LLP (57) ABSTRACT

Methods of filling high aspect ratio, narrow width (e.g., sub-50 nm) gaps on a substrate are provided. The methods provide gap fill with little or no incidence of voids, seams or weak spots. According to various embodiments, the methods depositing dielectric material in the gaps to partially fill the gaps, then performing multi-step atomic layer removal process to selectively etch unwanted material deposited on the sidewalls of the gaps. The multi-step atomic layer removal process involves a performing one or more initial atomic layer removal operations to remove unwanted material deposited at the top of the gap, followed by one or more subsequent atomic layer removal operations to remove unwanted material deposited on the sidewalls of the gap. Each atomic layer removal operation involves selectively chemically reacting a portion of the fill material with one or more reactants to form a solid reaction product, which is then removed.

18 Claims, 8 Drawing Sheets

U.S. PATENT DOCUMENTS

| | | | |
|---|---|---|---|
| 6,069,092 A * | 5/2000 | Imai et al. | |
| 6,071,815 A * | 6/2000 | Kleinhenz et al. | |
| 6,074,951 A * | 6/2000 | Kleinhenz et al. | |
| 6,204,198 B1 * | 3/2001 | Banerjee et al. | |
| 6,265,302 B1 * | 7/2001 | Lim et al. | |
| 6,335,261 B1 | 1/2002 | Natzle et al. | |
| 6,573,181 B1 | 6/2003 | Srinivas et al. | |
| 6,652,713 B2 | 11/2003 | Brown et al. | |
| 6,706,334 B1 | 3/2004 | Kobayashi et al. | |
| 6,726,805 B2 | 4/2004 | Brown et al. | |
| 6,776,874 B2 | 8/2004 | Kobayashi et al. | |
| 6,790,733 B1 | 9/2004 | Natzle et al. | |
| 6,803,309 B2 | 10/2004 | Chou et al. | |
| 6,817,776 B2 | 11/2004 | Colgan et al. | |
| 6,837,968 B2 | 1/2005 | Brown et al. | |
| 6,852,584 B1 | 2/2005 | Chen et al. | |
| 6,858,532 B2 | 2/2005 | Natzle et al. | |
| 6,905,965 B2 | 6/2005 | Subrah et al. | |
| 6,926,843 B2 | 8/2005 | Cantell et al. | |
| 6,949,481 B1 * | 9/2005 | Hallijal et al. | |
| 6,951,821 B2 | 10/2005 | Hamelin et al. | |
| 6,967,167 B2 | 11/2005 | Geiss et al. | |
| 6,992,011 B2 | 1/2006 | Nemoto et al. | |
| 7,029,536 B2 | 4/2006 | Hamelin et al. | |
| 7,079,760 B2 | 7/2006 | Hamelin et al. | |
| 7,416,989 B1 * | 8/2008 | Liu et al. | |
| 7,435,661 B2 * | 10/2008 | Miller et al. | |
| 2001/0016226 A1 | 8/2001 | Natzle et al. | |
| 2002/0106908 A1 | 8/2002 | Cohen et al. | |
| 2003/0029568 A1 | 2/2003 | Brown et al. | |
| 2003/0134038 A1 | 7/2003 | Paranjpe | |
| 2004/0018740 A1 | 1/2004 | Brown et al. | |
| 2004/0083977 A1 | 5/2004 | Brown et al. | |
| 2004/0182324 A1 | 9/2004 | Wallace et al. | |
| 2004/0184792 A1 | 9/2004 | Hamelin et al. | |
| 2004/0185670 A1 | 9/2004 | Hamelin et al. | |
| 2004/0200244 A1 | 10/2004 | Hung et al. | |
| 2004/0212035 A1 * | 10/2004 | Yeo et al. | |
| 2005/0056370 A1 | 3/2005 | Brown et al. | |
| 2005/0101130 A1 | 5/2005 | Lopatin et al. | |
| 2005/0106877 A1 | 5/2005 | Elers et al. | |
| 2005/0116300 A1 * | 6/2005 | Hieda et al. | |
| 2005/0205110 A1 | 9/2005 | Kao et al. | |
| 2005/0218113 A1 | 10/2005 | Yue | |
| 2005/0218507 A1 | 10/2005 | Kao et al. | |
| 2005/0221552 A1 | 10/2005 | Kao et al. | |
| 2005/0230350 A1 | 10/2005 | Kao et al. | |
| 2005/0266684 A1 | 12/2005 | Lee et al. | |
| 2005/0270895 A1 | 12/2005 | Strang | |
| 2006/0003596 A1 * | 1/2006 | Fucsko et al. | |
| 2006/0051966 A1 | 3/2006 | Or et al. | |

OTHER PUBLICATIONS

U.S. Office Action mailed Dec. 5, 2007 from U.S. Appl. No. 11/479,812.*

U.S. Office Action mailed Jul. 17, 2007 from U.S. Appl. No. 11/479,812.

U.S. Office Action mailed May 2, 2007 from U.S. Application No. 11/479,812.

U.S. Final Office Action mailed May 7, 2008 from U.S. Appl. No. 11/479,812.

T. Meguro et al., "Digital etching of GaAs: New approach of dry etching to atomic ordered processing", Apr. 16, 1990, American Institute of Physics pp. 1552-1554.

S.D. Park et al. "Atomic Layer Etching of Si(100) and Si(111) Using Cl2 and Ar Neutral Beam", Electrochemical and Solid-State Letters, 8 (8) C106-C109 (2005).

H. Ogawa et al., "Dry Cleaning Technology for Removal of Silicon Native Oxide Employing Hot NH3/NF3 Exposure", The Japan Society of Applied Physics, Part I, No. 8, Aug. 2002, pp. 5349-5358.

H. Nishino et al., "Damage-free selective etching of Si native oxides using NH3/NF3 and SF6/H2O down-flow etching", J. Appl. Phys. vol. 74, No. 2, Jul. 15, 1993, pp. 1345-1348.

Y. Yang et al., "Ultrahigh-selectivity silicon nitride etch process using an inductively coupled plasma source", J. Vac. Sci. Technol. A, vol. 16, No. 3, May/Jun. 1998, pp. 1582-1587.

Phan et al., Integrated Clean Process Using NF3/NH3 Remote Plasma for Nickle Silicide Formation, SEMICON Korea STS 2006, pp. 159-163.

S. Athavale et al., Molecular dynamics simulation of atomic layer etching of silicon, J. Vac. Sci. Technol. A, vol. 13, No. 3, May/Jun. 1995, pp. 966-971.

W. Natzle et al., "Trimming of hard-masks by Gaseous Chemical Oxide Removal (COR) for Sub-10nm Gates/Fins, for Gate Length Control and for Embedded Logic", 2004 IEEE/SEMI Advanced Semiconductor Manufacturing Conference, pp. 61-65.

Liu et al., "Modulating Etch Selectivity and Etch Rate of Silicon Nitride Thin Films," Novellus Systems, Inc., U.S. Appl. No. 12/002,085, filed Dec. 13, 2007.

Honda et al., "Chemical Dry Cleaning Technology for Reliable 65nm CMOS contact to NiSi$_x$", IITC-2005 paper9.4.

Okamura et al., "Low Damage Via Formation with Low Resistance by NH3 Thermal Reduction for Cu / Ultra Low-k Interconnects", 2004 IEEE, pp. 42-44.

Kim, et al., "New Contact Cleaning in HF & N2/H2 Microwave Plasma", Solid State Phenomena vol. 92, (2003), pp. 239-242.

Byun et al., The Effects of Reactive Precleaning (RPC+) on the Formation of Titanium Silicide By PECVD TiCl$_4$-Ti Deposition, and Its Thermal Stability, 2001, IEEE, pp. 222-224.

Taguwa, et al., "ICP-Ar/H$_2$ Precleaning and Plasma Damage-Free Ti-PECVD for Sub-Quarter Micron Contact of Logic with Embedded DRAM", Conference Proceedings USLI XV 2000, pp. 589-593.

Chang, et al., "Interface Characteristics of Selective Tungsten on Silicon Using a New Pretreatment Technology for ULSI Application", 1997 IEEE, pp. 738-743.

Park et al., "Low Damage in Situ Contact Cleaning Method by a Highly Dense and Directional ECR Plasma," Jpn J. Appl. Phys. vol. 35 (1996), pp. 1097-1101.

Schravendijk et al., "Protective Layer to Enable Damage Free Gap Fill," Novellus Systems, Inc., U.S. Appl. No. 12/002,171, filed Dec. 14, 2007.

Schravendijk et al., "Protective Layer to Enable Damage Free Gap Fill," Novellus Systems, Inc., U.S. Appl. No. 60/925,255, filed Apr. 18, 2007.

Liu et al., "Methods for Etching High Aspect Ratio Structures," Novellus Systems, Inc., U.S. Appl. No. 60/962,638, filed Jul. 30, 2007.

Liu et al., "Methods of Removing Silicon Nitride and Other Materials During Fabrication of Contacts and Interconnects," Novellus Systems, Inc., U.S. Appl. No. 60/905,782, filed Mar. 7, 2007.

Liu et al., "Methods of Removing Silicon Nitride and Other Materials During Fabrication of Contacts", Novellus Systems, Inc., U.S. Appl. No. 12/074,912, filed Mar. 7, 2009.

U.S. Notice of Allowance mailed Jul. 1, 2008 from U.S. Appl. No. 11/479,812 and Allowed Claims.

U.S. Appl. No. 11/479,812, Allowed Claims.

U.S. Office Action mailed Jan. 29, 2010 for U.S. Appl. No. 12/144,518.

U.S. Appl. No. 12/174,402, "Adsorption based material removal process", Liu et al., filed Jul. 16, 2008.

U.S. Appl. No. 12/244,241, "Gap fill using pulsed deposition layer and atomic layer removal", Drewery et al., filed Oct. 2, 2008.

U.S. Appl. No. 12/144,518, "Gap fill using pulsed deposition layer and atomic layer removal", Drewery et al., filed Jun. 23, 2008.

* cited by examiner

PRIOR ART

ATOMIC LAYER REMOVAL FOR HIGH ASPECT RATIO GAPFILL

CROSS REFERENCE TO RELATED APPLICATION

This application claims priority under 35 U.S.C. §119(e) to U.S. Provisional Application 61/089,453 entitled "ATOMIC LAYER REMOVAL FOR HIGH ASPECT RATIO GAP-FILL," filed Aug. 15, 2008, all of which is incorporated in its entirety by this reference.

FIELD OF THE INVENTION

This invention relates to electronic device fabrication processes and associated apparatus. More specifically, the invention relates to deposition and dry etch processes for forming dielectric layers, particularly in filling gaps with high aspect ratios.

BACKGROUND OF THE INVENTION

It is often necessary in semiconductor processing to fill high aspect ratio gaps with insulating material. This is the case for shallow trench isolation (STI), inter-metal dielectric (IMD) layers, inter-layer dielectric (ILD) layers, pre-metal dielectric (PMD) layers, passivation layers, etc. As device geometries shrink and thermal budgets are reduced, void-free filling of narrow width, high aspect ratio (AR) features (e.g., AR>6:1) becomes increasingly difficult due to limitations of existing deposition processes.

High density plasma (HDP) chemical vapor deposition (CVD), a directional (bottom-up) CVD process, is the method currently used for high aspect ratio gapfill. HDP CVD deposits more material at the bottom of a high aspect ratio structure than on its sidewalls. It accomplishes this by directing dielectric precursor species downward, to the bottom of the gap while simultaneously removing deposited material from the trench top through sputtering by the use of biased RF power applied to the substrate. The ratio of sputter to deposition (S/D) determines the property of the material deposited. A more conformal layer with better step coverage is achieved with a higher S/D ratio.

However, HDP CVD gapfill results in the formation of overhangs, at the entry region of the gap to be filled. These formations result from sputtering and redeposition processes. The directional aspect of the deposition process produces some high momentum charged species that sputter away material from within the gap. The sputtered material tends to redeposit on the sidewalls of high AR structures. As a result, the entry region of a high aspect ratio structure may close before bottom-up fill has been completed, leaving voids or weak spots within the structure. This phenomenon, known as "pinch-off," is exacerbated in narrow features. The overhangs cannot be totally eliminated because non-directional reactions of neutral species and sputtering and redeposition reactions are inherent to the physics and chemistry of the HDP CVD processes.

In some gap fill applications, particularly in the case of small features with high aspect ratios, a multi-step deposition/etch back process has been used in order to remove the overhangs and facilitate void-free gap fill. For example, a deposition and etch process utilizing HDP CVD deposition and an aqueous HF dip for the etch back step has been used. However, this requires that the wafers be cycled between the plasma deposition system and the wet etch back system for a number of cycles. This results in a long cycle time and correspondingly large capital investment to run the multiple steps for gap fill.

In-situ multi-step plasma deposition/etch processes have also been used to keep the entry to the gap from closing before it is filled. Such in-situ HDP CVD deposition and etch back processes are described, for example, in U.S. Pat. Nos. 7,163,896, 6,030,881, 6,395,150, and 6,867,086, the disclosures of which are incorporated herein by reference for all purposes. Some of these in-situ plasma etch back processes use high-energy ions to create a significantly anisotropic sputter etch. Other in-situ plasma etch back processes use chemically-reactive etch gases (e.g., nitrogen trifluoride, $NF_3$) to create a significantly isotropic plasma etch.

While these in-situ multi-step deposition and etch back processes have improved high aspect ratio gap fill capabilities, dielectric deposition processes that can reliably fill high aspect ratio features of narrow width, particularly very small features continue to be sought.

SUMMARY OF THE INVENTION

The present invention pertains to methods of filling high aspect ratio (typically at least 6:1, for example 7:1 or higher), narrow width (e.g., sub-50 nm) gaps on a substrate. The methods provide gap fill with little or no incidence of voids, seams or weak spots. According to various embodiments, the methods depositing dielectric material in the gaps to partially fill the gaps, then performing multi-step atomic layer removal process to selectively etch unwanted material deposited on the sidewalls of the gaps. The multi-step atomic layer removal process involves a performing one or more initial atomic layer removal operations to remove unwanted material deposited at the top of the gap, followed by one or more subsequent atomic layer removal operations to remove unwanted material deposited on the sidewalls of the gap. Each atomic layer removal operation involves selectively chemically reacting a portion of the fill material with one or more reactants to form a solid reaction product, which is then removed. The multi-step atomic layer removal process removes unwanted side-wall deposition without removing bottom fill.

One aspect of the invention relates to methods for filling features that are formed as openings in a substrate. The methods involve depositing a fill material at the bottom of the feature and on the substrate surface adjacent to the opening to partially fill the feature, thereby causing formation of a cusp structure on the sidewalls of the feature and fill material deposited on the substrate surface adjacent to the opening. A portion of the fill material is then reacted with a reactant to form a solid reaction product such that a least a portion of the material deposited on the substrate surface adjacent to the opening is converted to the solid reaction product but leaving the cusp structure unreacted. The reaction is performed to leave the opening unblocked, though possible narrowed, by the solid reaction product. The solid reaction product is then removed, thereby exposing the unreacted cusp structure and unreacted material at the bottom of the gap. A portion of the fill material is again reacted with a reactant to form a solid reaction product, this time such that a least a portion of the cusp structure is converted the solid reaction product; wherein said solid reaction product does not block the opening. The solid reaction product is removed, thereby exposing unreacted material at the bottom of the gap. The depositing operation is repeated to fill the feature. The openings, prior to deposition, are narrow in certain embodiments, e.g., less than about 60 nm or less than about 50 nm.

According to various embodiments, the methods may further include, prior to converting at least a portion of the cusp structure to a solid reaction product, repeating the reacting and removing operations to remove additional unwanted deposition material from the substrate surface.

Reacting and removing unwanted deposition material from the substrate surface may permit etchants to penetrate to the unwanted cusp structure in the subsequent etch operation, where they otherwise would be unable to do so. The methods may also involve repeating the reacting and removing operations to remove additional unwanted deposition material from the cusp structure. In certain embodiments, the cusp structure is completely removed prior to repeating the deposition operation.

Another aspect of the invention relates to methods for filling a feature formed as an opening in a substrate having a surface that involve depositing a fill material at the bottom of the feature and on the substrate surface adjacent to the opening. Deposition in the feature causes formation of a cusp structure on the sidewalls of the feature. Multiple cycles of an etch and removal process without an intervening deposition operation are then performed. A cycle includes the operations of reacting a portion of the unwanted fill material with a reactant to form a solid reaction product and removing the solid reaction product, thereby exposing unreacted material at the bottom of the gap. The depositing operations are repeated to fill the feature. The openings, prior to the initial deposition, are narrow in certain embodiments, e.g., less than about 60 nm or less than about 50 nm. In certain embodiments, forming a solid reaction product in at least one cycle leaves the opening at least partially unblocked.

In certain embodiments, a first set of one or more cycles selectively removes unwanted material from the substrate surface adjacent to the opening, such that material is removed from substrate surface adjacent to the opening and not from the cusp structure or other parts of the feature. A second set of one or more cycles subsequent to the first set of one or more cycles selectively removes unwanted material from the cusp structure.

Another aspect of the invention relates to methods for filling a gaps on a semiconductor substrate that involve depositing a fill material to partially fill the gap, thereby depositing fill material at the bottom of the gap, unwanted fill material in a cusp formation on the gap sidewalls and unwanted fill material on the substrate surface above or adjacent to the gap, then reacting fill material with one or more reactants to form a solid reaction product from unwanted fill material on the substrate surface, removing the solid reaction product, thereby leaving unreacted fill material at the bottom of the gap and unreacted fill material in a cusp formation, reacting fill material with one or more reactants to form a solid reaction product from unwanted fill material in the cusp formation; and removing the solid reaction product, thereby leaving unreacted fill material at the bottom of the gap and removing unwanted material in the cusp formation.

Yet another aspect of the invention relates to methods for filling features formed as an opening in a substrate having a surface, the feature having a bottom, a sidewall region proximal to the substrate surface and a sidewall intermediate region between the proximal region and the bottom. The methods involve depositing a fill material at the bottom of the feature, on the sidewalls of the surface and on the substrate surface adjacent to the opening; reacting a portion of the fill material with a reactant to form a solid reaction product such that a least a portion of the material deposited on the substrate surface adjacent to the opening is converted to the solid reaction product; wherein at least of portion of said fill material deposited on the sidewall intermediate region is unreacted and said solid reaction product does not block the opening, removing the solid reaction product, thereby exposing the unreacted sidewall material and unreacted material at the bottom of the gap; reacting a portion of the fill material with a reactant to form a solid reaction product such that a least a portion of the cusp structure is converted the solid reaction product; wherein said solid reaction product does not block the opening, removing the solid reaction product, thereby exposing unreacted material at the bottom of the gap, and repeating said depositing step to fill the feature.

In certain embodiments, the second removal operation removes dielectric material that is deeper in the gap than the material removed by the first removal operation. Also in certain embodiments, fill material is deposited by a conformal deposition technique, such as atomic layer deposition and pulsed deposition layer.

These and other aspects of the invention are described in further detail below with reference to the drawings.

DETAILED DESCRIPTION OF THE PRESENT INVENTION

Introduction

Embodiments of the present invention are described herein in the context of a filling a gap with dielectric material for shallow trench isolation (STI). Those of ordinary skill in the art will realize that the following detailed description of the present invention is illustrative only and is not intended to be in any way limiting. Other embodiments of the present invention will readily suggest themselves to such skilled persons having the benefit of this disclosure. For example, although STI application is discussed, the method are applicable on other types of applications (e.g., IMD, ILD, PMD and passivation layers). Further, the concepts discussed herein may be applied in etching a patterned blanket dielectric layer.

Reference will be made in detail to implementations of the present invention as illustrated in the accompanying drawings. The same reference indicators will be used throughout the drawings and the following detailed description to refer to the same or like parts. In this application, the terms "work piece," "wafer" and "substrate" will be used interchangeably. The following detailed description assumes the invention is implemented on a wafer. However, the invention is not so limited. The work piece may be of various shapes, sizes, and materials (e.g., displays of various sizes).

Figure 1A:
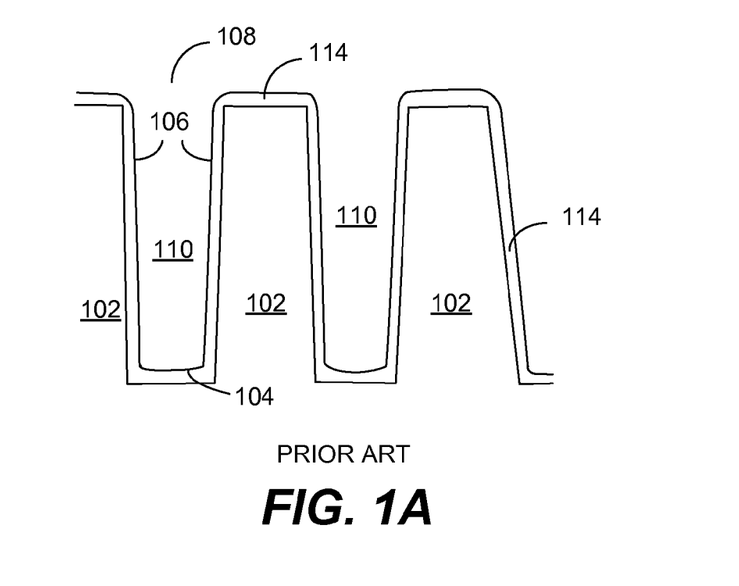
FIGS. 1A-1C depict rough schematic cross-sectional diagrams of certain operations in a gap fill process.

The invention relates to dep/etch/dep gapfill processes utilizing an ALR chemical etch process. The methods described herein are able to fill structures having openings of less than 50 nm. FIG. 1A shows a cross section of a high-density region of a substrate with partially filled gaps 110 and structures 102. A gap may be defined its bottom 104, sidewalls 106 and entry region 108. The gap 110 may be lined with an oxide layer, such as a thermally grown silicon oxide layer 114. As such, a thin layer (e.g., 10-200 Å, for example 100 Å) of silicon oxide (114) is formed on the gap bottom 104 and sidewalls 106 prior to being filled with a gap fill material. The substrate surface next to the entry region 108 is also generally lined with the same oxide layer. Although not depicted in the schematic, an additional protective layer, such as described in U.S. patent application Ser. No. 12/002,171, incorporated by reference herein, may also line the gap.

Figure 1B:
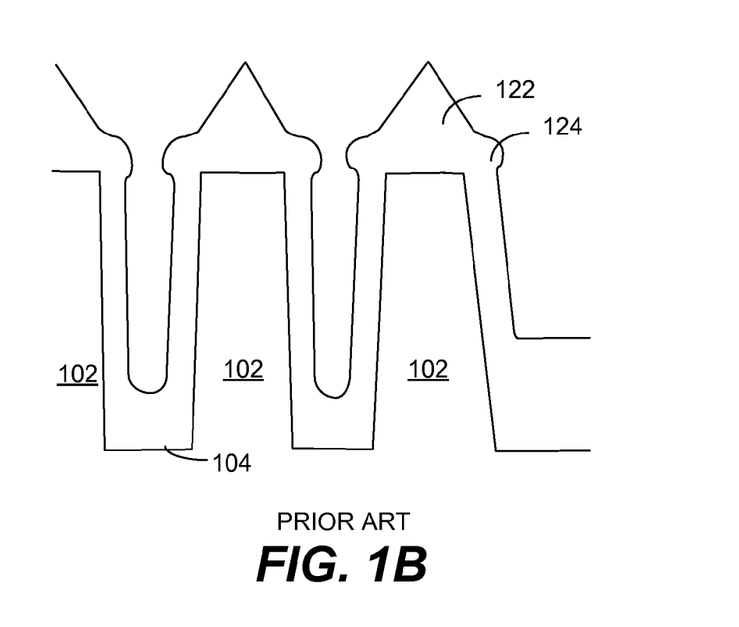

FIG. 1B shows gaps 110 after an initial high density plasma chemical vapor deposition (HDP CVD) process has partially filled them with a dielectric material 120. The HDP CVD deposition performs bottom-up filling of the gap resulting in a thicker film on the bottom 104 than on the sidewall 106. Due to the nature of the deposition process, there are both top hat formations 122 and cusps 124 formed. Top hat formations refer to material deposited above the feature, adjacent to the gap opening. Top hat formations may, but do not necessarily, form part of an overhang structure. (In the example shown in FIG. 1B, the top hats 122 do not form part of the overhang or cusp 124.

Cusps are regions on the sidewall in which there is a narrowing of the opening from a bottom-up perspective. In FIG. 1B, cusps 124 are at the entry region 108 of the gap 110, but depending on the structure shape and the deposition methods, cusps may form below the top surface. The cusps typically result from the non-directional deposition reactions of neutral species in the plasma reactor and from sputtering/redeposition processes. Limitations due to overhang formation become ever more severe as the width of the gap to be filled decreases, the aspect ratio increases, and the features become reentrant (i.e., the sidewalls of the feature taper inwardly at the bottom of the feature.) At some point prior to the material pinching off, overhang or cusp material is removed, allowing another deposition cycle.

Figure 1C:
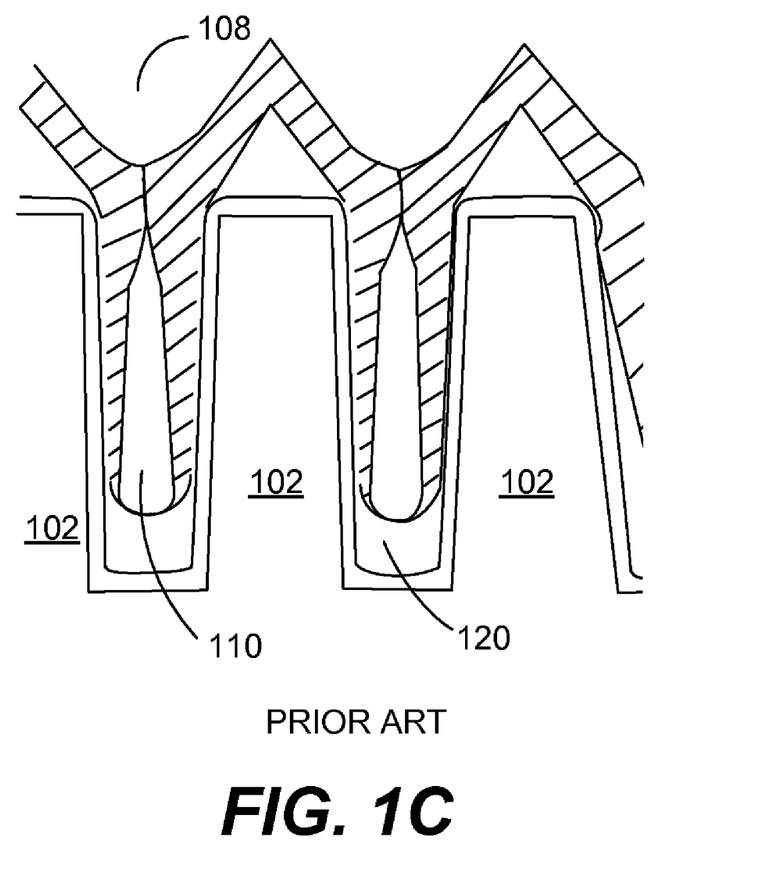

One method of removing unwanted deposition in a partially filled gap is atomic layer removal. ALR methods are disclosed in U.S. Pat. No. 6,335,261, "Directional CVD Process with Optimized Etchback" by Natzle et al., the relevant disclosure of which is incorporated by reference herein. It describes an optimized chemical oxide removal (COR) process in which the fill material is reacted to form a solid reaction product having a greater specific volume than the fill material it consumes. As a result, the overhang structure is converted to a reaction product structure blocking the gap opening Because the solid reaction product (e.g., ammonium hexafluorosilicate or AHFS) pinches off the opening, the etchants do not penetrate to the bottom of the gap, thus allowing selective etching of the upper portion of the gaps. This is shown in FIG. 1C. The reaction product is then decomposed and removed, thereby opening the gap and exposing unreacted fill material at the bottom of the gap. The deposition and etch processes are then repeated as necessary to fill the gap.

Figure 2A:
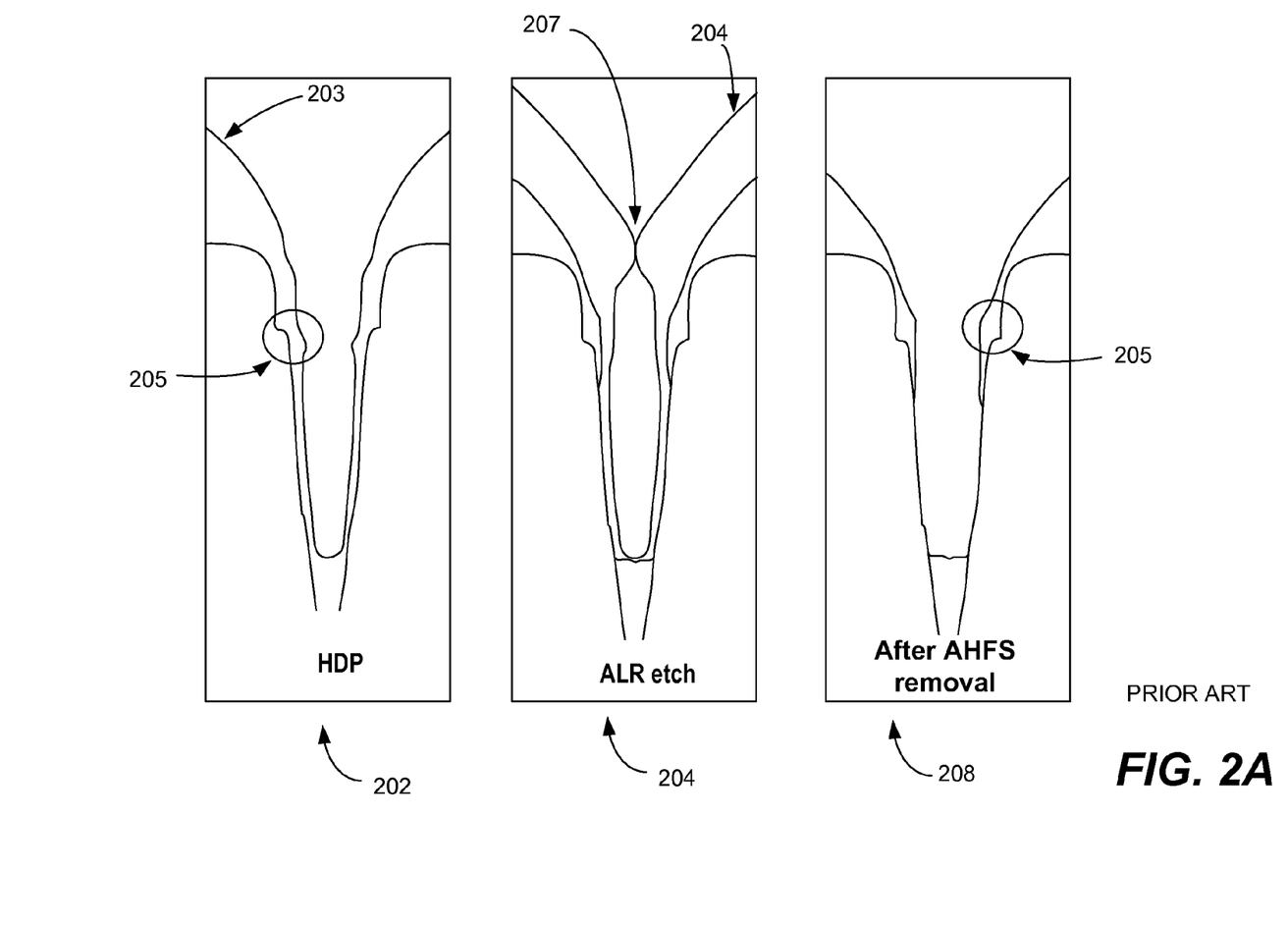
FIG. 2A depicts a cross-sectional diagram of single cycle conventional atomic layer removal process.

While conventional ALR does not remove bottom fill in dense features as wet etch processes do, in certain applications it has the tendency to leave a significant amount of sidewall deposition in the gaps. This is especially true for very narrow gaps. It has been found that this because the AHFS pinch-off occurs high enough that not only do etchants not penetrate to the bottom of the gap (as is desired) but they do not penetrate to the cusps on the sidewalls. FIG. 2A shows a schematic of conventional ALR as applied to a narrow gap. At 202, the feature is shown after being partially filled by HDP, leaving top hat deposition at 203 and a cusp at 205. The ALR etch operation is shown at 204: the solid AHFS 206 has pinched off at 207. After AHFS removal, the cusp 205 is still present. See 208. Subsequent HDP is hampered by the presence of this cusp.

Figure 2B:
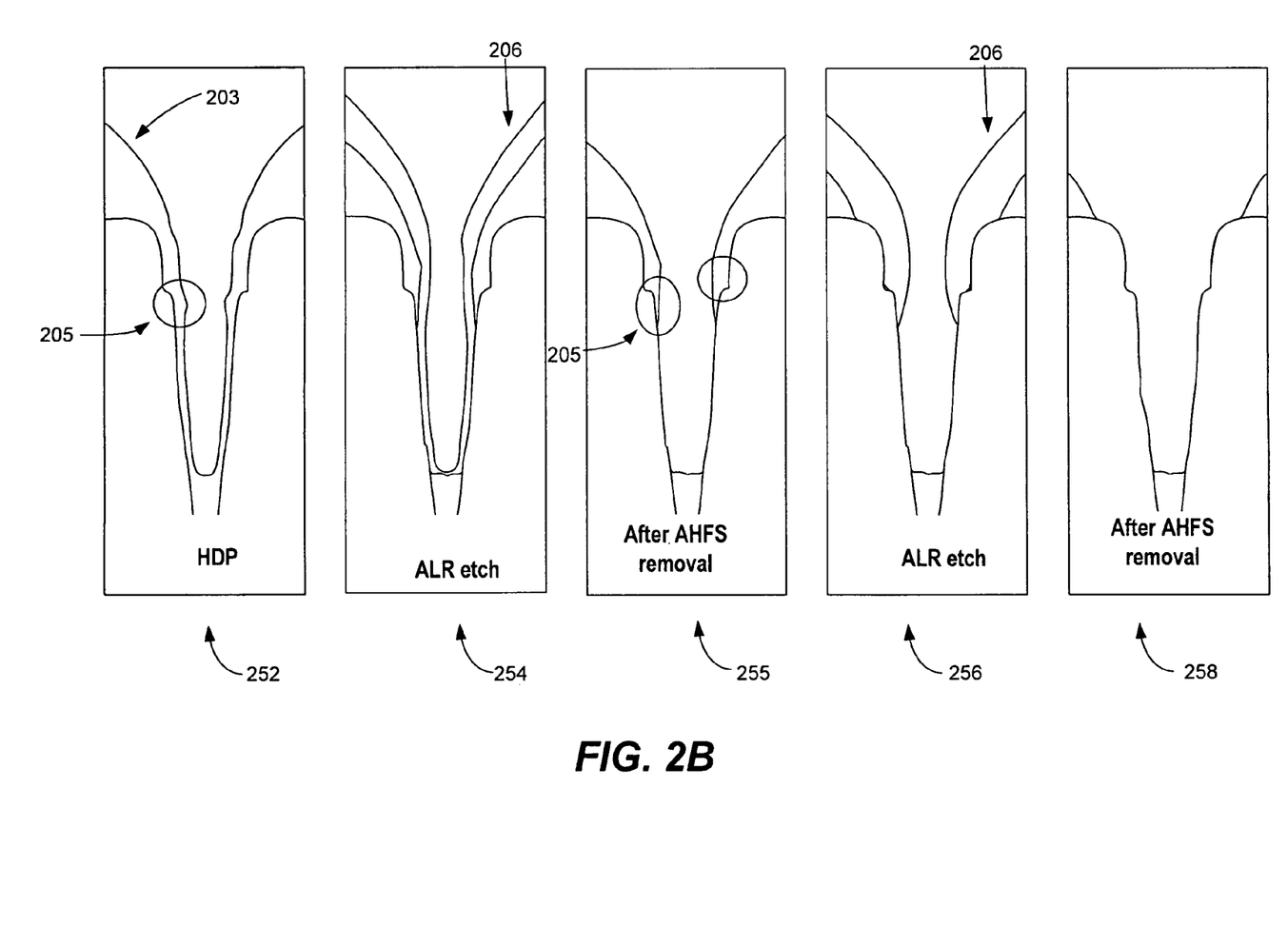
FIG. 2B depicts a cross-sectional diagram of a multi-cycle atomic layer removal process in accordance with various embodiments.
Figure 3:
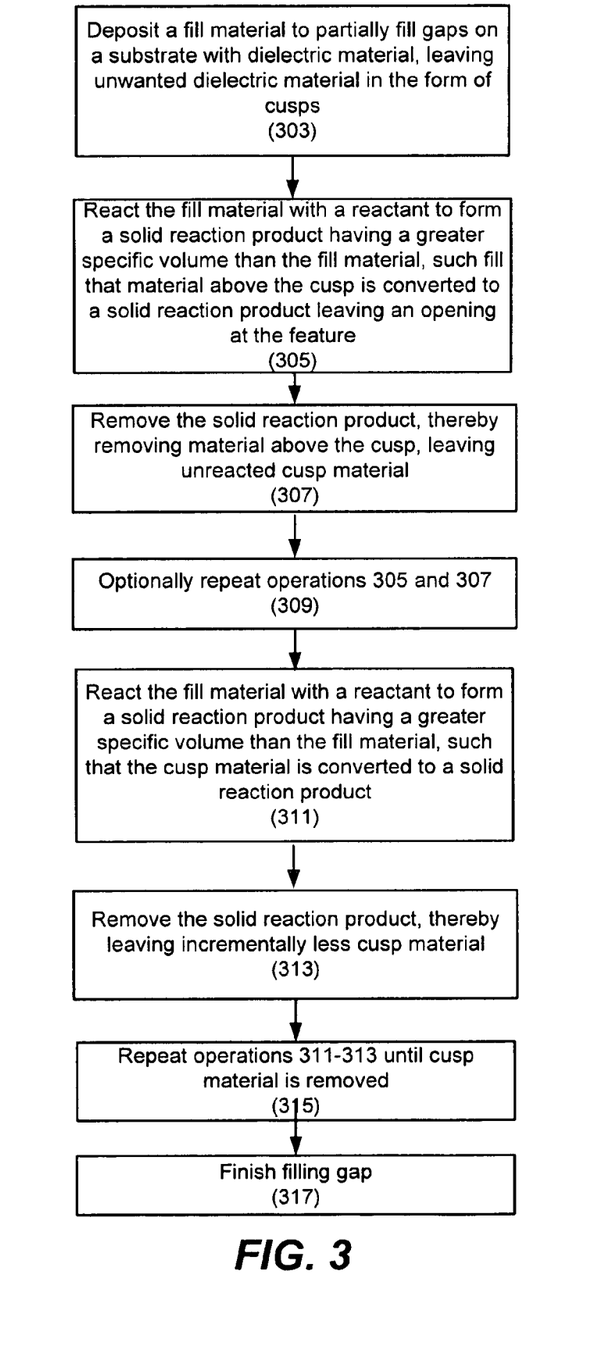
FIG. 3 is a process flow diagram depicting a process in accordance with the present invention.

The methods described herein provide efficient removal of sidewall cusps, enabling good gapfill for sub-50 nm gaps. FIG. 3 is a process flow diagram illustrating operations in a method of filling gaps on a substrate according to various embodiments. First, in an operation 303, one or more gaps on a substrate is partially filled with dielectric material, leaving unwanted sidewall deposition. In particular embodiments, at least one of the gaps is has an opening of 50 nm or less. Though HDP is used in many embodiments to partially fill the gaps, the methods are not limited to HDP deposition, but may be used with pulsed deposition layer (PDL), atomic layer deposition (ALD), plasma-enhanced chemical vapor deposition (PECVD) and other gap fill dielectric deposition methods. Then in an operation 305, the substrate is exposed to gaseous reactants, which penetrate into the dielectric material and react with the material to form a solid reaction product having a higher specific volume that the fill material. Note that, unlike in conventional ALR processes, the solid reaction product does not pinch off the gap opening. This is a significant difference between conventional ALR processes and the processes described herein: in conventional ALR, pinching off is performed as it prevents reactants from reaching the bottom of the gap. As explained further below, the methods described herein prevent the bottom from being etched, while eliminating the problem of incomplete sidewall etching conventional ALR processes have with narrow openings that are described above with respect to FIG. 2A. The reaction product is removed, e.g., by desorption, sublimation or rinsing (e.g. with DI water), etching material above the cusp region and leaving the unreacted cusp material. See block 307. Operations 305 and 307 describe the first ALR operation, which is used to reduce top hat material, opening up the gap so that the etchants can reach the cusp in subsequent operations. FIG. 2B shows a schematic of an ALR process according to an embodiment of the method described in FIG. 3 as applied to the feature inadequately etched by the process shown in FIG. 2A. As with the conventional ALR process, at 252, the feature is partially filled by HDP, leaving top hat 203 and cusp 205 depositions. An initial ALR etch operation is shown at 254, with solid AHFS material 206. Note that unlike the conventional ALR etch shown at 204, the AHFS does not pinch off. After AHFS removal (258), the cusp 205 is still present, but with the top hat 203 profile changed. See 255. Returning to FIG. 3, the etch and removal operations 305 and 307 are repeated as necessary to change the profile of the material deposited above the cusp sufficiently so that the reactants are able to penetrate the cusp material in subsequent etches. See 309. The number of times, if any, operations 305 and 307 are repeated depends on the initial profile of the deposited material, which in turn depends on the deposition method and the structure profile. Once the top hat profile has been sufficiently altered, an etch operation is performed to react cusp material and form a solid dielectric product in an operation 311. This material is then removed via a sublimation or other process. See 313. FIG. 2B shows the second ALR etch at 256. Because of the top hat reduction in the first ALR etch and sublimation, the cusp 205 has good exposure to ALR chemistry. At least some of the cusp is removed after sublimation, as shown at 258. Returning to FIG. 2B, although not shown, in certain embodiments, operations 311 and 313 are repeated to remove additional sidewall material. Operations 311-313 are repeated until cusp is removed. See 315. If necessary, operations 303-315 are repeated until the subsequent deposition will be sufficient to fill the gap. A deposition is the performed to fill the gap in an operation 317.

Returning to FIG. 2B, which shows the solid reaction AHFS product 206 formed during ALR etch operations 254 and 256. As discussed above, unlike conventional ALR operations, the AHFS does not pinch off. Despite not pinching off, it was found that the bottom of the feature is not etched significantly. This result was unexpected as conventional ALR methods use the pinch off to prevent reactants from reaching the bottom of the fill. Without being bound by a particular theory, it is believed that in the narrow gaps described, the reactants do not diffuse to the bottom of the gaps and/or are consumed prior to reaching the bottom of the gap. In certain embodiments, the AHFS or other solid reaction product may pinch off in one or more of the initial etch operations that are geared toward removing the top hat deposition. Note also that while most of the deposition removed in the first ALR etch is from the region above the cusp (e.g., the top-hat), there may be some sidewall deposition removed as well. In general, at least a portion of the cusp structure remains after the initial one or more etch operations described in 305-309, and in certain embodiments, all or most of it remains. All or part of the cusp structure is removed by the second set of one or more ALR operations described in 311 and 313. If all of the cusp structure is removed, there is no narrowing of the opening from the bottom up.

As indicated above, the deposition is not limited to HDP gap fill. While cusps and re-entrant features are common with HDP gap fill, the methods may be used advantageously to shape the profile of the partially filled gap after dielectric deposition. Referring back to FIG. 3, operation 303 may be performed using any gap fill deposition method, for example, a conformal method such as ALD or PDL. In these cases, a cusp is not typically formed. However, the multi-cycle ALR described in operations 305-313 is used in certain embodiments to shape the profile, e.g., by making nearly vertical profiles into V-shaped (positively shaped profiles). In such cases, the first one or more cycles (described in operations 305-309) remove material proximate to the top of a feature, with each subsequent cycle etching deeper into the trench or other gap. The second one or more cycles (described in operations 311 and 313) remove sidewall material deeper in the gap than removed in the first set of one or more cycles. Again, each cycle within the set will etch deeper into the feature than the previous cycle. Across a variety of deposition methods and profiles, the multi-cycle ALR methods described herein may be used to progressively etch deeper into a gap to give the desired profile. Note that in certain embodiments, the amount of reactants used (e.g., as metered by exposure time), may change from cycle-to-cycle to shape the profile as desired.

In certain embodiments, the gaseous reactants are ammonia ($NH_3$) and dry hydrogen fluoride (HF), in the proportion of approximately two parts ammonia to three parts hydrogen fluoride, which may react to form solid AHFS as shown:

In another embodiment, these reactants are used in a ratio of two parts hydrogen fluoride to one part ammonia to produce solids AHFS. In still other embodiments, the reactants may include hydrogen ($H_2$), nitrogen trifluoride ($NF_3$), $NH_4F$, and $NH_4F$:HF. Ammonium fluoride ($NH_4F$) or ammonium bifluoride ($NH_4F \cdot HF$) may be directly introduced into the chamber, instead of being formed from ammonia and hydrogen fluoride, or other reactants, e.g., ammonia ($NH_3$), hydrogen fluoride (HF), hydrogen ($H_2$), nitrogen trifluoride ($NF_3$), nitrogen ($N_2$), and water vapor ($H_2O$). The gaseous reactants and solid reaction product are not limited to these, but may be any solid reaction product that can be removed.

In certain embodiments, removal of the solid reaction product is accomplished by heating the substrate so that the reaction product will desorb or sublimate, and may then be pumped away. The methods are not limited to this type of removal, and may be used with other methods of removing the solid reaction product.

Figure 5:
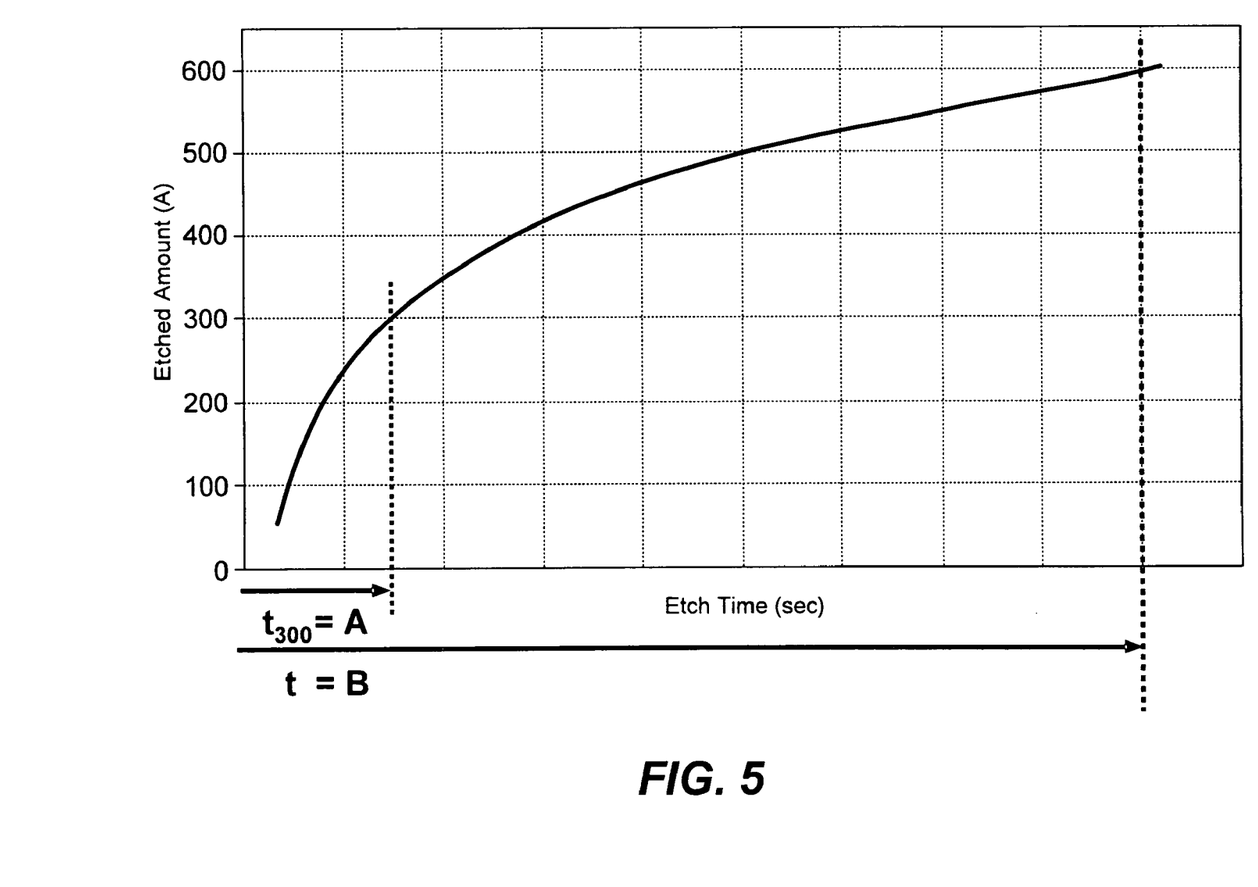
FIG. 5 is a plot of thickness etched over time in a representative atomic layer removal process.

Although the multi-cycle ALR process described above may be used to remove cusp features formed in sub-50 nm (opening) features that cannot be removed by conventional single-cycle ALR, in certain embodiments, it may be used advantageously for wider features as well. FIG. 5 shows an example of a etch amount vs. etch time for a typical ALR process. As can be seen from the figure, the highest rate of etch occurs at the beginning of an etch cycle. Accordingly, in certain embodiments, the methods described above are applied to gaps of any size when the time to perform two sequential etch and removal cycles (plus overhead time) is less than the time it takes for a single such cycle. For total etch amounts of 400 Angstrom and above, sequential processing in a multi-station apparatus may be preferred over parallel processing.

Apparatus

Figure 4:
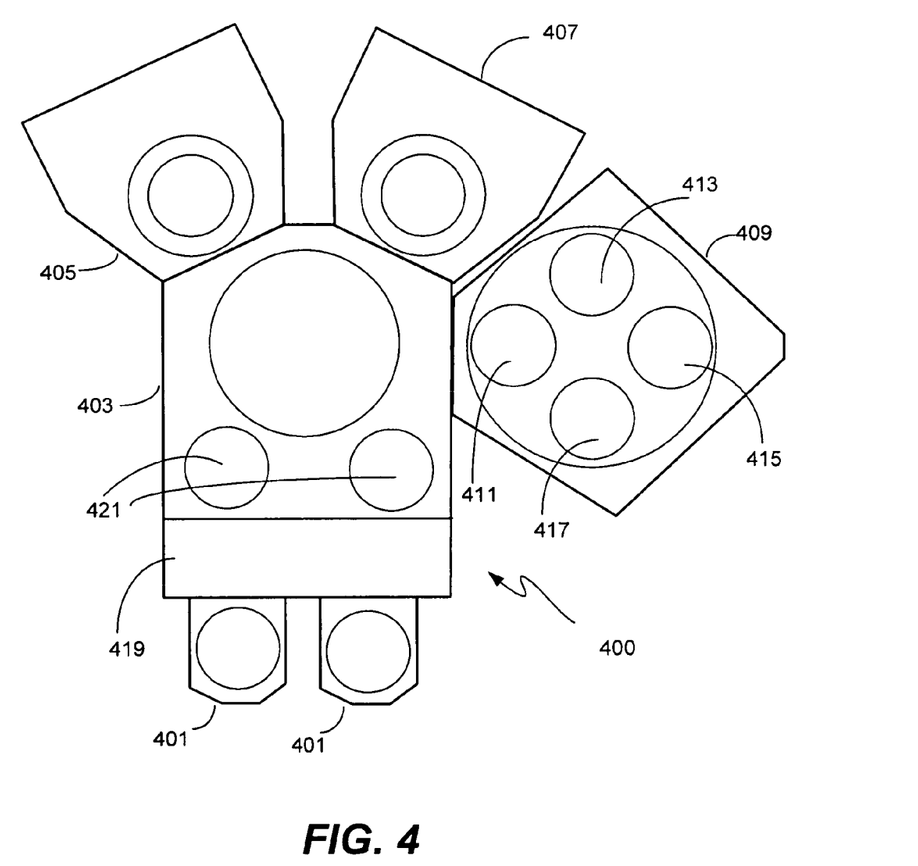
FIG. 4 is a block diagram of a plasma processing system suitable for conducting a gap fill process in accordance with the present invention.

In one embodiment, a single semiconductor processing tool may be configured to perform every operation of the method embodiment of the present invention. FIG. 4 shows an example of a semiconductor processing tool 400 with two HDP CVD chambers 405/407 and a multi-station chamber 409 capable of performing the operations of the ALR etch method embodiment.

Partially fabricated semiconductor substrates enter the system 400 from cassettes at 401, or front-opening unified pods (FOUPs). The substrates are individually removed from the FOUP into the atmospheric chamber 419 by an atmospheric robot (not shown) to one of two load locks 421. After the load lock pressure is pumped down to that of the transfer chamber 403, a transfer chamber robot (not shown) transfers the substrate to the first process chamber module, 405 or 407. Each process chamber module may be capable or be configured to perform both protective liner formation, HDP CVD fill material deposition and HDP plasma etch (optional). In some embodiments, the chamber module may be dedicated to either the protective liner formation or the fill material deposition operation. In one embodiment, the substrate enters chamber 405 to form a protective liner by nitriding an oxide surface, then transfers to chamber 407 to deposit a fill material. In other embodiments, the operations are performed sequentially in the same chamber (405 or 407) by changing process gas and flow rate, chamber pressure, source RF power, bias power, and substrate pedestal temperature.

The ALR etch operations may be performed in a multi-station chamber such as chamber 409 of FIG. 4. The ALR etch module 409 may have two or more stations. As depicted, the module has 4 stations. Each station may perform the same operation or different operations. In one embodiment, the station 1 (411) delivers the ALR reactants to cause the reaction to form a solid reaction product. Station 2 (413) removes the solid reaction product by decomposing, or subliming, the solid and removing the by-product gases. Station 3 (415)

could repeat the reactant exposure to cause further etching reaction. Station 4 (417) could then remove the additional solid reaction product.

The individual stations in multi-station chamber 409 may be micro-volume stations. A micro-volume station may have a volume less than 1 liter, preferably less than 500 milliliter. Using a micro-volume station reduces the amount of reactants used and saves material costs. The individual stations may also have a clam-shell configuration such that the interior volume of the station may be isolated from that of the greater chamber 409. The individual stations may be separated by a gas curtain. Of course, other configurations to isolate the interior volume of the station may be used, as well as configurations where the stations are not isolated.

After the ALR etch operations in chamber 409, if no further deposition and etching is required, then the substrate is returned to loadlocks 421 for cool down before exiting the tool 400 via FOUPs 401. Alternatively, loadlocks 421 may be used for cooldown after the HDP CVD deposition operation. However, in most embodiments, after the ALR etch operations in chamber 409, the substrate is transferred to one of the HDP CVD chambers 405/407 for fill material deposition.

In another embodiment, the semiconductor processing tool may have several single station chambers each dedicated to one operation or configured to perform all of the operations in sequence. For example, chamber 409 may be a single-station chamber that can be configured to perform the ALR etch operations. Also, more than one chamber 409 may be configured on the tool.

The apparatus may also include a controller configured to execute a set of instructions. The set of instructions may be instructions to deposit a fill material until an overhang structure partially blocks the gap opening; to react a portion of the fill material with one or more reactants to form a solid reaction product; to desorb the solid reaction product, and then to repeat these reaction and desorption operations. The set of instructions may also include instructions to perform typical HDP CVD deposition/etch steps. These instructions are to perform the operations in the method embodiment of the present invention using various chambers of the apparatus for different operations.

A suitable semiconductor processing tool may be C2 or C3 SPEED configured with one or more HDP CVD chambers and an ALR etch module, available from Novellus Systems, Inc. of San Jose, Calif. Another suitable semiconductor processing tool may be a SiCoNi tool or a Centura configured with one or more Ultima chambers and other chambers, available from Applied Materials, Inc. of Santa Clara, Calif.

In still other embodiments, more than one semiconductor processing tool may be used to perform the operations of the method embodiment. For example, the ALR selective layer may be formed in a different tool such as the VECTOR or SEQUEL tool available from Novellus Systems, Inc. The ALR etch process may be performed in a modified PDL tool available from Novellus Systems, Inc.

Experimental Data

Figure 6:
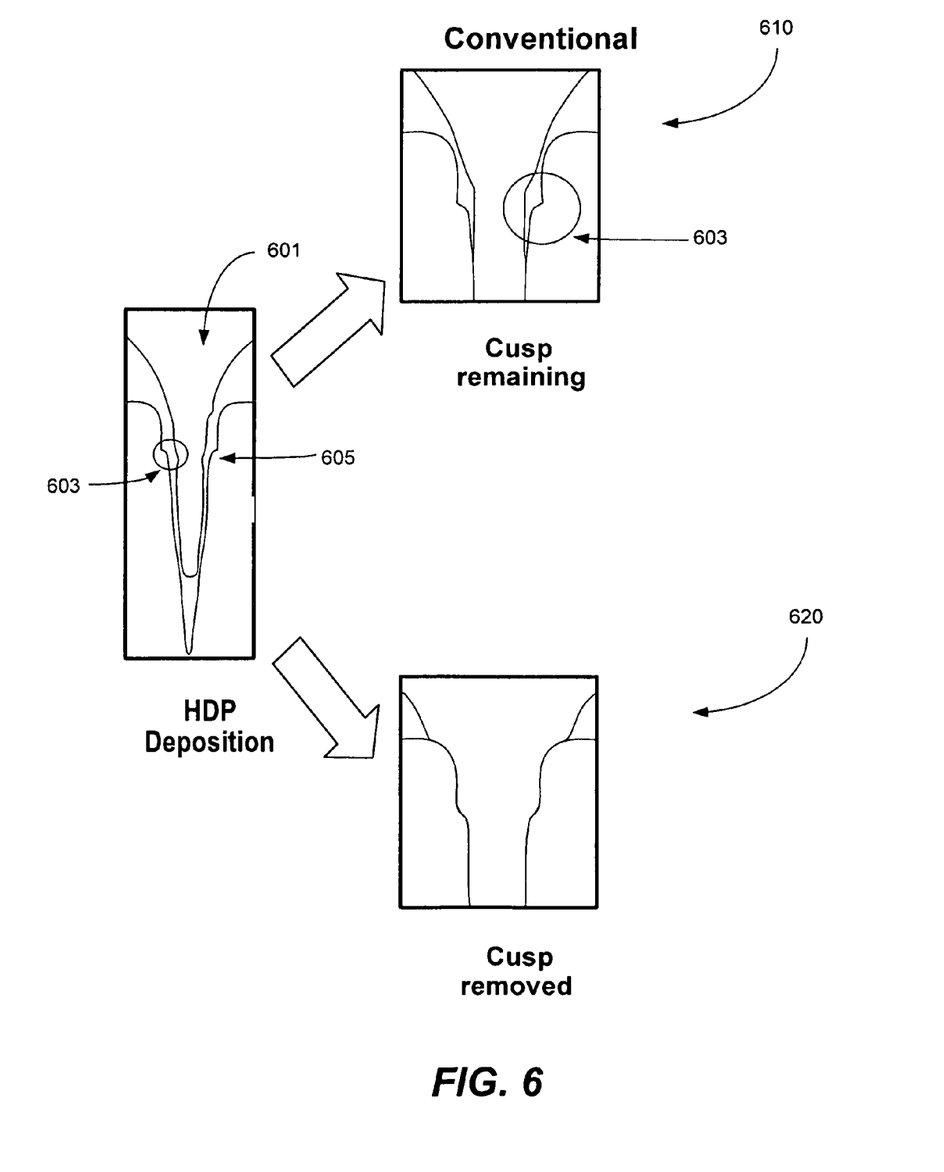
FIG. 6 shows cross-sectional representations of a partially filled feature having a cusp structure and the tops of such a feature after a) a single cycle atomic layer removal process, and b) a multi-cycle atomic layer removal process.

Tests were conducted to demonstrate improvement in ALR etch selectivity using an embodiment of the invention described above. An ALR etch process was performed on two identical substrates, with a nominal thickness of about 45 nm. For a first substrate, a single ALR cycle was performed and for second substrate a multi-cycle ALR process as described above was performed. FIG. 6 shows a cross-sectional representation of the partially filled gap 601, with cusp 603 formed at the shoulder area 605 of the feature. A cross-sectional representation of the top of the feature after conventional ALR is shown at 610. Note that cusp 603 remains. A cross-sectional representation of the top of the feature after multi-cycle ALR is shown at 620. The cusp is removed.

Comparison tests were also conducted on substrates having gaps ranging from 52 nm to 86 nm (center critical dimension, or CD). Repeated deposition-ALR cycles were performed to fill the gaps. S/D ratio was 0.6. For the substrates on which conventional ALR was performed, 400 Angstroms of material was etched in each cycle. For the multi-cycle process, 100 Angstroms of material was etched in each of 4 ALR cycles. The conventional process provided good gap fill for 80 nm and 86 nm CD, but resulted in voids at 62 nm and 52 nm. The multi-cycle resulted in good gap fill with no voids (at 54 nm, 66 nm, 78 nm and 86 nm).

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein.

What is claimed is:

1. A method for filling a feature formed as an opening in a substrate having a surface, the feature having a bottom, the method comprising:
   depositing a fill material at the bottom of the feature and on the substrate surface adjacent to the opening, wherein deposition in the feature causes formation of a cusp structure on the sidewalls of the feature;
   reacting a portion of the fill material with a reactant to form a solid reaction product such that a least a portion of the material deposited on the substrate surface adjacent to the opening is converted to the solid reaction product; wherein said cusp structure is unreacted and said solid reaction product does not block the opening;
   removing the solid reaction product, thereby exposing the unreacted cusp structure and unreacted material at the bottom of the gap;
   reacting a portion of the fill material with a reactant to form a solid reaction product such that a least a portion of the cusp structure is converted the solid reaction product; wherein said solid reaction product does not block the opening;
   removing the solid reaction product, thereby exposing unreacted material at the bottom of the gap; and
   repeating said depositing step to fill the feature.

2. The method of claim 1, further comprising, prior to converting at least a portion of the cusp structure to a solid reaction product, repeating the reacting and removing operations to remove additional unwanted deposition material from the substrate surface.

3. The method of claim 1 wherein reacting and removing unwanted deposition material from the substrate surface permits etchants to penetrate to the unwanted cusp structure in a subsequent etch operation.

4. The method of claim 1 wherein the opening, prior to deposition, is less than 60 nm.

5. The method of claim 1 wherein the opening, prior to deposition, is less than 50 nm.

6. The method of claim 1, further comprising, repeating the reacting and removing operations to remove additional unwanted deposition material from the cusp structure.

7. The method of claim 1, wherein the cusp structure is completely removed prior to repeating the deposition operation.

8. A method for filling a feature formed as an opening in a substrate having a surface, the feature having a bottom, the method comprising:
   depositing a fill material at the bottom of the feature and on the substrate surface adjacent to the opening, wherein deposition in the feature causes formation of a cusp structure on the sidewalls of the feature;
   after depositing the fill material at the bottom of the feature, performing multiple cycles of an etch and removal process without an intervening deposition operation, wherein a cycle comprises the operations of reacting a portion of the unwanted fill material with a reactant to form a solid reaction product and removing the solid reaction product, thereby exposing unreacted material at the bottom of the gap; and
   repeating said depositing step to fill the feature.

9. The method of claim 8 wherein during at least one of the multiple cycles, forming a solid reaction product comprises leaving the opening at least partially unblocked.

10. The method of claim 8 wherein the opening, prior to deposition, is less than 60 nm.

11. The method of claim 8 wherein the opening, prior to deposition, is less than 50 nm.

12. The method of claim 8 wherein a first set of one or more cycles selectively removes unwanted material from the substrate surface adjacent to the opening.

13. The method of claim 12 wherein a second set of one or more cycles subsequent to the first set of one or more cycles selectively removes unwanted material from the cusp structure.

14. A method for filling a gap on a semiconductor substrate, the method comprising:
   depositing a fill material to partially fill the gap, thereby depositing fill material at the bottom of the gap, unwanted fill material in a cusp formation on the gap sidewalls and unwanted fill material on the substrate surface above or adjacent to the gap;
   reacting fill material with one or more reactants to form a solid reaction product from unwanted fill material on the substrate surface;
   removing the solid reaction product, thereby leaving unreacted fill material at the bottom of the gap and unreacted fill material in a cusp formation;
   reacting fill material with one or more reactants to form a solid reaction product from unwanted fill material in the cusp formation; and
   removing the solid reaction product, thereby leaving unreacted fill material at the bottom of the gap and removing unwanted material in the cusp formation.

15. A method for filling a feature formed as an opening in a substrate having a surface, the feature having a bottom, a sidewall region proximal to the substrate surface and a sidewall intermediate region between the proximal region and the bottom, the method comprising:
   depositing a fill material at the bottom of the feature, on the sidewalls of the surface and on the substrate surface adjacent to the opening;
   reacting a portion of the fill material with a reactant to form a solid reaction product such that a least a portion of the material deposited on the substrate surface adjacent to the opening is converted to the solid reaction product; wherein at least of portion of said fill material deposited on the sidewall intermediate region is unreacted and said solid reaction product does not block the opening;
   removing the solid reaction product, thereby exposing the unreacted sidewall material and unreacted material at the bottom of the gap;
   reacting a portion of the fill material with a reactant to form a solid reaction product such that a least a portion of the cusp structure is converted the solid reaction product; wherein said solid reaction product does not block the opening;
   removing the solid reaction product, thereby exposing unreacted material at the bottom of the gap; and
   repeating said depositing step to fill the feature.

16. The method of claim 15 wherein the second removal operation removes dielectric material that is deeper in the gap than the material removed by the first removal operation.

17. The method of claim 15 wherein the depositing a fill material comprises depositing the fill material by a conformal deposition technique.

18. The method of claim 17 wherein the conformal deposition technique is selected from atomic layer deposition and pulsed deposition layer.

* * * * *